United States Patent
Wu et al.

(10) Patent No.: US 7,943,954 B2
(45) Date of Patent: *May 17, 2011

(54) LED FABRICATION VIA ION IMPLANT ISOLATION

(75) Inventors: Yifeng Wu, Goleta, CA (US); Gerald H. Negley, Carrboro, NC (US); David B. Slater, Jr., Durham, NC (US); Valeri F. Tsvetkov, Durham, NC (US); Alexander Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/507,288

(22) Filed: Jul. 22, 2009

(65) Prior Publication Data

US 2009/0309124 A1 Dec. 17, 2009

Related U.S. Application Data

(60) Division of application No. 11/154,619, filed on Jun. 16, 2005, now Pat. No. 7,592,634, which is a continuation of application No. 10/840,463, filed on May 6, 2004, now Pat. No. 7,338,822.

(51) Int. Cl.
*H01L 33/00* (2010.01)
(52) U.S. Cl. .............. 257/101; 257/79; 257/94; 257/98; 257/99; 257/E33.001
(58) Field of Classification Search .................... 257/79, 257/94, 98, 99, 101
See application file for complete search history.

(56) References Cited

U.S. PATENT DOCUMENTS

| | | | |
|---|---|---|---|
| 3,824,133 A | 7/1974 | D'Asaro et al. |
| 4,968,582 A | 11/1990 | Tranjan et al. |
| 5,010,023 A | 4/1991 | Einthoven et al. |
| 5,091,757 A | 2/1992 | Yoshida |
| 5,114,827 A | 5/1992 | Tranjan et al. |
| 5,119,540 A | 6/1992 | Kong et al. |

(Continued)

FOREIGN PATENT DOCUMENTS

JP 5-046052 6/1993

(Continued)

OTHER PUBLICATIONS

Feldman et al., High Resistivity Group III-V Compounds By Helium Bombardment, Reg. No. H147, Nov. 4, 1986.

(Continued)

*Primary Examiner* — Wai-Sing Louie
(74) *Attorney, Agent, or Firm* — Myers Bigel Sibley & Sajovec

(57) ABSTRACT

A semiconductor light emitting diode includes a semiconductor substrate, an epitaxial layer of n-type Group III nitride on the substrate, a p-type epitaxial layer of Group III nitride on the n-type epitaxial layer and forming a p-n junction with the n-type layer, and a resistive gallium nitride region on the n-type epitaxial layer and adjacent the p-type epitaxial layer for electrically isolating portions of the p-n junction. A metal contact layer is formed on the p-type epitaxial layer. In method embodiments disclosed, the resistive gallium nitride border is formed by forming an implant mask on the p-type epitaxial region and implanting ions into portions of the p-type epitaxial region to render portions of the p-type epitaxial region semi-insulating. A photoresist mask or a sufficiently thick metal layer may be used as the implant mask.

19 Claims, 5 Drawing Sheets

U.S. PATENT DOCUMENTS

| | | | |
|---|---|---|---|
| 5,149,670 A | 9/1992 | Isshiki | |
| 5,210,051 A | 5/1993 | Carter, Jr. | |
| 5,248,760 A | 9/1993 | Du Bois et al. | |
| 5,393,642 A | 2/1995 | Du Bois et al. | |
| 5,393,993 A | 2/1995 | Edmond et al. | |
| 5,416,342 A | 5/1995 | Edmond et al. | |
| 5,466,949 A | 11/1995 | Okuno | |
| 5,635,412 A | 6/1997 | Baliga et al. | |
| 5,637,511 A | 6/1997 | Kurihara | |
| 5,679,153 A | 10/1997 | Dmitriev et al. | |
| 5,718,760 A | 2/1998 | Carter et al. | |
| 5,838,706 A | 11/1998 | Edmond et al. | |
| 5,838,708 A * | 11/1998 | Lin et al. | 372/50.21 |
| 5,866,925 A | 2/1999 | Zolper et al. | |
| 5,874,747 A | 2/1999 | Redwing et al. | |
| 5,912,477 A | 6/1999 | Negley | |
| 5,914,499 A | 6/1999 | Hermansson et al. | |
| 5,998,232 A | 12/1999 | Maruska | |
| 6,025,289 A | 2/2000 | Carter et al. | |
| 6,057,565 A | 5/2000 | Yoshida et al. | |
| 6,063,186 A | 5/2000 | Irvine et al. | |
| 6,090,300 A | 7/2000 | Walker et al. | |
| 6,111,273 A | 8/2000 | Kawai | |
| 6,187,606 B1 | 2/2001 | Edmond et al. | |
| 6,200,917 B1 | 3/2001 | Carter et al. | |
| 6,201,262 B1 | 3/2001 | Edmond et al. | |
| 6,204,084 B1 | 3/2001 | Sugiura et al. | |
| 6,217,662 B1 | 4/2001 | Kong et al. | |
| 6,218,677 B1 | 4/2001 | Broekaert | |
| 6,235,617 B1 | 5/2001 | Kawai | |
| 6,255,129 B1 * | 7/2001 | Lin | 438/26 |
| 6,278,136 B1 | 8/2001 | Nitta | |
| 6,297,522 B1 | 10/2001 | Kordina et al. | |
| 6,373,077 B1 | 4/2002 | Edmond et al. | |
| 6,432,788 B1 | 8/2002 | Maruska et al. | |
| 6,459,100 B1 | 10/2002 | Doverspike et al. | |
| 6,492,661 B1 | 12/2002 | Chien et al. | |
| 6,582,986 B2 | 6/2003 | Kong et al. | |
| 6,740,906 B2 | 5/2004 | Slater, Jr. et al. | |
| 6,787,406 B1 | 9/2004 | Hill et al. | |
| 6,791,119 B2 | 9/2004 | Slater, Jr. et al. | |
| 7,592,634 B2 * | 9/2009 | Wu et al. | 257/94 |
| 2002/0017727 A1 | 2/2002 | Uemura | |
| 2002/0022290 A1 | 2/2002 | Kong et al. | |
| 2002/0066718 A1 | 6/2002 | Matsuyama | |
| 2002/0093020 A1 | 7/2002 | Edmond et al. | |
| 2002/0096496 A1 | 7/2002 | Molnar et al. | |
| 2002/0123164 A1 | 9/2002 | Slater, Jr. et al. | |
| 2002/0139987 A1 | 10/2002 | Collins et al. | |
| 2003/0008425 A1 | 1/2003 | Uemura | |
| 2003/0015721 A1 | 1/2003 | Slater, Jr. et al. | |
| 2003/0122478 A1 | 7/2003 | Suehiro et al. | |
| 2005/0029533 A1 | 2/2005 | Wu et al. | |
| 2005/0078725 A1 | 4/2005 | Wang | |

FOREIGN PATENT DOCUMENTS

JP    2000-077713 A    3/2000

OTHER PUBLICATIONS

Zolper et al., Nitrogen and Fluorin ion implantation in InGaN, vol. 66, pp. 3042-3044, 1995.

S. Wolf, Silicon Processing For VLSI ERA, vol. 1, Lattice Press, pp. 282.

Office Action and Search Report corresponding to ROC (Taiwan) Patent Application No. 093112923 dated Oct. 12, 2010; 14 pages.

* cited by examiner

LED FABRICATION VIA ION IMPLANT ISOLATION

RELATED APPLICATIONS

This is a divisional of application Ser. No. 11/154,619 filed Jun. 16, 2005 and now U.S. Pat. No. 7,592,634. Ser. No. 11/154,619 is a continuation of application Ser. No. 10/840,463, filed May 6, 2004, now U.S. Pat. No. 7,338,822. This application is also related to Ser. No. 10/987,627 filed Nov. 12, 2004 (now abandoned) and to copending application Ser. No. 12/387,882 filed Dec. 4, 2008.

BACKGROUND

The present invention relates to the manufacture and packaging of semiconductor light emitting diodes ("LED"). An LED is a semiconductor device that emits light whenever current passes through it. In its simplest form, a light emitting diode includes a p-type portion and an n-type portion to define a p-n junction diode. When mounted on a lead frame and encased in an encapsulant (usually a polymer), the overall LED package is also referred to as a "lamp."

Because of the high reliability, long life and generally low cost of LEDs, they have gained wide acceptance in a variety of lighting applications in many fields of application.

LED lamps are extremely tough. They typically do not include glass and avoid filaments entirely. As a result, LED lamps can take abuse far beyond that of the incandescent lamp and their high reliability can greatly reduce or eliminate many maintenance factors and costs.

LED lamps can be extremely efficient, e.g., emitting light equal to an incandescent lamp while consuming only 10 percent of the electricity. Many LEDs have life spans of 100,000 hours; i.e. equivalent to over 11 years of continuous use. Therefore, from a statistical standpoint, most LED's will never fail once they are initially tested (typically as part of the production process). LED lamps are excellent for use in unusual or difficult environments such as near explosive gases or liquids. Although individual light choices (solid state versus incandescent or fluorescent) still must be designed and tested for each particular use, as a general rule, LED lights are a safer choice in a wide variety of applications.

LED lamps are energy efficient and environmentally friendly. They minimize the use of electricity and batteries, and their relatively low current requirements means they can be solar powered more easily.

The nature, structure and operation of LEDs is generally well-understood. A conceptual discussion and understanding of the nature and operation of light emitting diodes and the physics and chemistry that support their operation, can be found for example in textbooks such as Sze, PHYSICS OF SEMICONDUCTOR DEVICES, 2d Ed. (1981) and Sze, MODERN SEMICONDUCTOR DEVICE PHYSICS (1998).

A number of commonly assigned patents and co-pending patent applications likewise discuss the theory and nature of light emitting diodes, including but not limited to U.S. Pat. Nos. 6,582,986; 6,459,100; 6,373,077; 6,201,262; 6,187,606; 5,912,477; 5,416,342; and 5,838,706; and Published U.S. Applications Nos. 20020093020 and 20020123164. The contents of these are incorporated entirely herein by reference.

As all of these sources attest, the color emitted by a light emitting diode depends upon the nature of the semiconductor material from which it is formed. As particularly set forth in the commonly assigned patents and applications, light in the green, blue, violet, and ultraviolet portions of the electromagnetic spectrum has higher energy compared with red or yellow light. Such high energy light can typically only be generated using materials having a wide band gap, that is, a bandgap sufficient to create photons with the required energy. ("Bandgap" is an intrinsic quality of a semiconductor material that determines the energy released when a photon is generated in the material.) Silicon carbide, gallium nitride, and other Group III nitrides, as well as certain II-VI compounds such as ZnSe and ZnS are examples of wide-bandgap semiconductor materials capable of generating blue, green and/or UV light. As further set forth in the incorporated references, of these materials, gallium nitride and other Group III nitrides have begun to emerge as favorite materials for LED production.

For a number of packaging and use applications, a favored design for a light emitting diode is the "vertical" orientation. The term "vertical" is not used to describe the final position of the overall device, but instead to describe an orientation within the device in which the electrical contacts used to direct current through the device and its p-n junction are positioned on opposite faces (axially) from one another in the device. Thus, in its most basic form, a vertical device includes a conductive substrate, a metal contact on one face of the substrate, two or more epitaxial layers on the opposite face of the substrate to form the p-n light-emitting junction, and a top contact on the top epitaxial layer to provide a current path through the layers and their junction and the substrate to the substrate contact.

In the latest-generation LEDs produced by the assignee of the present invention, e.g., published U.S. Application No. 20020123164, the basic LED structure includes a silicon carbide substrate, an n-type gallium nitride epitaxial layer on the substrate, a p-type gallium nitride layer on the n-type layer, thereby forming a p-n junction and a metal stack on the p-type layer, which also forms the top contact to the device. It has been found that the emission of light from such devices can be enhanced by carefully selecting the transparency and geometry of the substrate to maximize the emission of light based upon its expected wavelength and the index of refraction of the silicon carbide substrate and potentially that of the packaging material. Accordingly, in the latest commercial embodiments, the light emitting diode is positioned on a lead frame with the epitaxial layers of the diode adjacent the lead frame with the silicon carbide substrate above them. This orientation is sometimes referred to as "flip chip" or "junction down" and will be discussed in more detail with respect to the drawings. The leadframe is the metal frame onto which a die is attached and bonded. Parts of the leadframe may become the external connections of the circuit.

Although the "flip chip" design is advantageous, it may result in a very small tolerance or space between and among the lead frame, the die attachment metal, the metal contact layers of the device, and the terminal edges of the epitaxial layers. Because the epitaxial layers include and define the p-n junction, the tolerances between the metal and the junction can be as small as 1-5 microns. Accordingly when the LED is mounted in a substrate-up, junction-down orientation on the lead frame, and with a metal (or other functionally conductive material) being used to provide an electrical contact between the lead frame and the ohmic contact to the p-type portion of the diode, the metal used to attach the LED to the lead frame can inadvertently make contact with the n-type layer and form a parasitic (i.e. unwanted) metal-semiconductor connection known to those skilled in the art as a Schottky contact.

Additionally, the passivation layer (typically silicon nitride) that is often added to protect the diode can crack following thermal or mechanical stress and thus provide additional possibilities for the development of undesired contacts to the epitaxial layers of the device.

By way of comparison and explanation, the problem described is essentially non-existent when diodes are positioned on the lead frame with the substrate rather than the epitaxial layers adjacent the lead frame. In such cases, the direct electrical contact between the die attachment metal and the (typically) n-type silicon carbide substrate is of course desired in order to provide current flow through the substrate and the junction.

In a typical LED manufacturing process, epitaxial layers of one or more semiconducting materials are grown on a semiconductor substrate wafer. Such wafers are typically between 2 inches and 4 inches in diameter, depending upon the semiconductor materials being used. Because individual LED die are typically quite small (e.g., 300×300 microns), a large quantity of LED die may be formed on a substrate wafer and its epitaxial layers in a geometric grid pattern. In order to successfully produce individual devices, the LED die in the grid must be separated from one another, both physically and electrically. Once the LEDs have been formed on a wafer, they are then separated into individual die, or groups of die, using well understood separation techniques such as sawing, scribe-and-break or the like.

The process of die separation may be harmful to exposed p-n junction regions. Therefore, prior to separation, it is known to isolate individual die while they remain on the wafer. The most typical method of isolation, which also serves to clearly define the devices and the location for their ohmic contacts, is to carry out one or more photolithography steps and etching the epitaxial layers to define a junction-containing mesa for each device or device precursor.

Although photolithography is a useful technique in semiconductor design and manufacturing, it requires specific equipment and materials and adds process steps. For example, a typical photolithography process can include the steps of adding a layer of photoresist (typically a polymer resin sensitive to light) to a semiconductor structure, positioning a mask over the photoresist, exposing the photoresist to a frequency of light to which it responds (by undergoing a chemical change; usually its solubility in a particular solvent), etching the photoresist to remove the exposed or unexposed pattern (depending upon the resist selected), and then carrying out the next desired step on the remaining pattern. In particular, when the purpose of the patterning step is to define an etch pattern in a GaN-based layer, GaN's chemical, physical, and thermal stability (which are favorable characteristics in finished devices) can cause additional difficulties if the etchant removes the resist before fully removing the desired pattern of material.

Accordingly, forming mesa-type LEDs that include a top contact metal layer will typically require at least two full sets of these steps; one set for patterning and etching the mesa and another set for patterning and depositing the metal contact layer.

Therefore, improvements in isolating devices from one another can provide corresponding improvements in the structure and performance of LEDs and LED layers.

DETAILED DESCRIPTION

Figure 1:
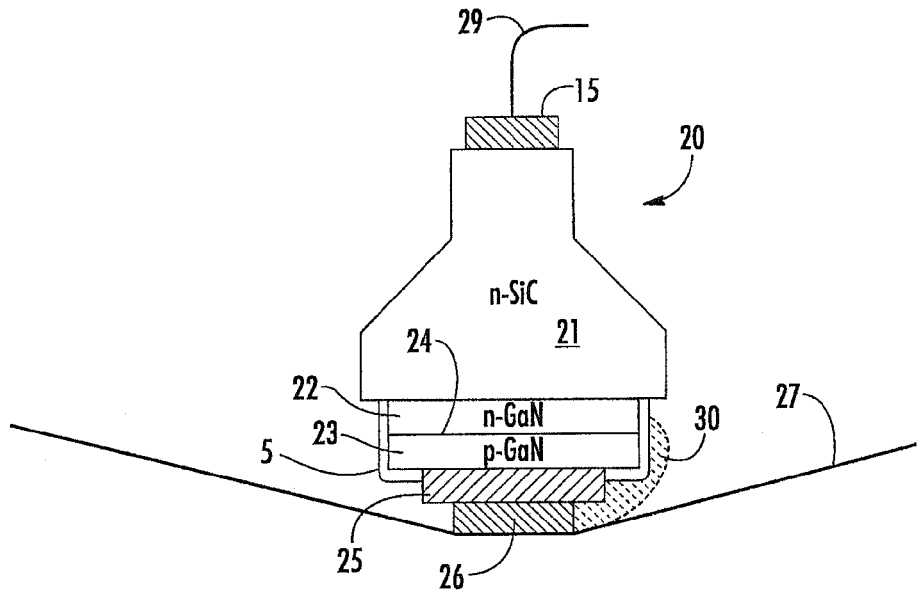
FIG. 1 is a cross-sectional diagram of an LED according to the prior art mounted on a lead frame in a flip-chip orientation.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, it will be understood that when a first element or layer is described as "in electrical contact" with a second element or layer, the first and second elements or layers need not be in direct physical contact with one another, but may be connected by intervening conductive elements or layers which permit current flow between the first and second elements or layers.

FIG. 1 is a cross-sectional schematic view of a light emitting diode broadly designated at 20 and illustrated in a manner that illustrates the potential problems than can arise when light emitting diodes mounted in certain orientations. Although the light emitting diode 20 is shown in fairly simplified fashion, it will be understood by those of ordinary skill in this art that the device 20 can be more sophisticated (i.e. include more elements) than illustrated herein. In the present circumstances, however, the invention can be clearly understood using basic illustrations. An exemplary diode of the type illustrated at 20 and some of its variations are also described in commonly assigned and co-pending application Publication No. US20020123164, the contents of which are incorporated entirely herein by reference.

The diode 20 includes a substrate 21 which may be n-type silicon carbide having a polytype selected from the group consisting of the 2H, 4H, 6H, 8H, 15R, and 3C polytypes of silicon carbide. The diode portion of the device 20 is illustrated by the respective n-type gallium nitride region 22 and p-type gallium nitride region 23, which together define a p-n junction 24. Region 22 and region 23 may each comprise a single layer or a group of related layers having different compositions, thicknesses, dopant concentrations or other qualities. The diode 20 also includes an ohmic contact 25 to the p-type gallium nitride epitaxial region 23 and a die attach metal 26 in electrical contact with the ohmic contact. As described in U.S. patent application Ser. No. 10/200,244 which is incorporated herein by reference as if fully set forth herein the die attach metal 26 may physically contact a bond pad (not shown) such as a gold or silver layer. Moreover, reflector, barrier, and other metal layers (not shown) may be formed between die attach metal 26 and the ohmic contact 25. Ohmic contact 15 may be formed on substrate 21 to form a vertical device as described above, and a wire lead 29 may be connected to contact 15 for connecting the device to an external circuit. Moreover, in the device illustrated in FIG. 1, a passivation layer 5 comprising an insulating material such as silicon nitride or silicon dioxide covers or an insulating polymer such as polyamide and protects the exposed surfaces of the epitaxial regions 22, 23.

The diode 20 is typically mounted on a metal or metallized lead frame 27, which provides an electrical contact between the diode 20 and an external circuit. As set forth in the background, in typical environments, the die attach metal 26 is formed of a metal that melts at a relatively low temperature, e.g., lower than the ohmic contact 25 and low enough such that other package components are not damaged during the die attach process. Accordingly, die attach metal 26 may comprise a solder such as tin or an alloy such as gold/tin. The die attach metal permits the diode 20 to be mounted on the lead frame quickly and easily via soldering or thermosonic bonding. In this regard, FIG. 1 also illustrates that if the die attach metal is formed imprecisely (which is always a possibility given the very small scale and size of most devices) a portion 30 of the die attach metal 26 can extend beyond the desired contact with the ohmic contact 25 and can contact the p-type gallium nitride region 23 or the n-type gallium nitride region 22. In these circumstances, the imprecise or unwanted portion 30 of the die attach metal may contact n-type gallium nitride layer 22 and can form an unwanted and parasitic Schottky diode with the n-type layer 22, or if it extends far enough, with the n-type silicon carbide substrate 21.

Figure 2:
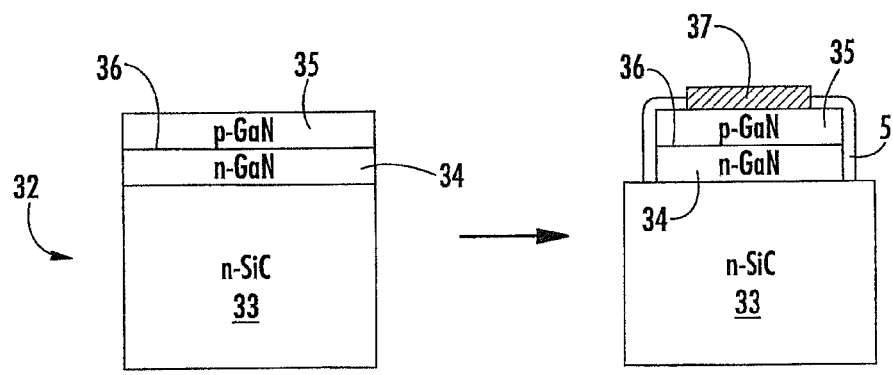
FIG. 2 is a cross-sectional diagram of the basic elements of an LED before and after a mesa is formed and a metal contact is added.

FIG. 2 illustrates a conventional manner of defining or isolating a junction in a light-emitting diode. As in the case of FIG. 1, the diode (broadly designated at 32) has been illustrated in its most fundamental aspects and can include additional elements that for the sake of clarity are not illustrated in FIG. 2. As in the case of the diode 20 in FIG. 1, the diode 32 includes an n-type silicon carbide substrate 33, an n-type epitaxial layer of gallium nitride 34 on the substrate 33, and a p-type layer of gallium nitride 35 on the n-type layer, and defining the p-n junction 36. In order to define and isolate the junction, the epitaxial layers 34 and 35 are typically etched to form the mesa structure illustrated in the right-hand portion of FIG. 2, which also shows an ohmic contact 37 to the p-type epitaxial layer 35. In many circumstances, the junction 36 within the mesa formed by etching the layers 34 and 35 is covered with silicon dioxide or some other appropriate insulating or dielectric material to help protect the junction 36 from external contamination and/or damage during die separation, packaging, or other processing steps, or during operation.

As recognized by those of skill in this art, in order to form the layers 35 and 36 into a mesa, a number of additional steps must be carried out. These typically include a masking step to define the pattern for the etch, which in turn includes the steps of laying down the mask (typically a photoresist), placing the optical pattern over the photoresist, exposing, and developing the resist, removing the developed (or as the case may be, undeveloped) portions of the mask and etching the underlying epitaxial layers, then removing the photoresist. Although these steps are now common in the semiconductor industry and can be carried out with a high degree of precision, they add additional engineering and cost factors to the overall manufacturing process, and for well-understood reasons, each additional manufacturing step can create a small lack of tolerance or precision in the end device.

Figure 3:
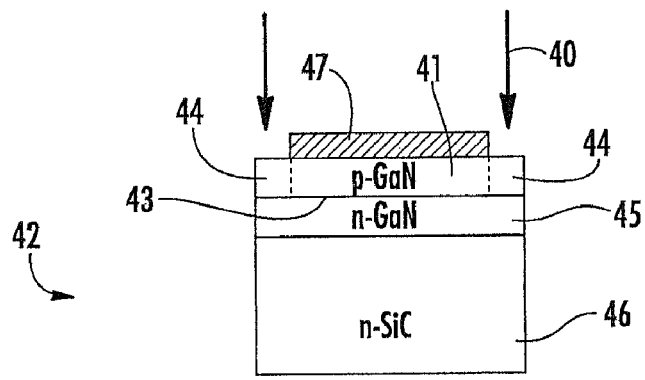
FIGS. 3 and 3A are respective a cross-sectional and top plan diagrams of an LED and schematically illustrating implantation according to embodiments of the present invention.

FIG. 3 is a broad schematic illustration of a junction-defining method of embodiments of the present invention. The method comprises implanting ions represented schematically by the arrows 40 into an epitaxial layer 41 in the diode broadly designated at 42 adjacent the p-n junction 43. Epitaxial layer 41 has a first conductivity type (illustrated in FIG. 3 as p-type). The type and amount of the implanted ions increase the resistivity of implanted region 44 and may render the implanted region 44 highly resistive and/or semi-insulating. In this context, "highly resistive" means that the material is sufficiently resistive such that negligible current flow occurs when a voltage bias is applied to the anodes of adjacent die on a wafer. That is, the material in implanted regions 44 is considered highly resistive for purposes of this invention if it substantially electrically isolates adjacent die. In some embodiments, the resistivity of the implanted regions 44 is at least 2000 Ω-cm. If the resistivity of the material is sufficiently high, the material may be considered semi-insulating (or "i-type") material rather than p-type or n-type semiconductor material. In general, material having a resistivity in excess of $1 \times 10^5$ Ω-cm at room temperature may be considered semi-insulating for purposes of this invention.

Figure 3A:
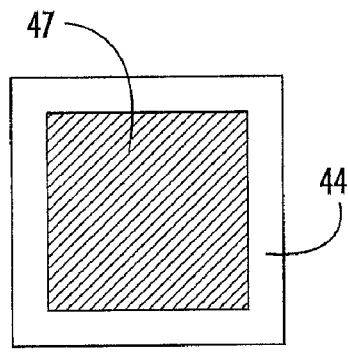

The ions 40 may be implanted in a pattern that defines an implanted perimeter 44 as more clearly illustrated in FIG. 3A. The perimeter 44 may be sufficiently doped with the implanted ions 40 to be highly resistive to thereby isolate or define the junction 43 with the implanted perimeter 44. FIG. 3 also illustrates the n-type layer 45, the substrate 46, and the metal contact 47. The dashed lines in the epitaxial layer 41 also help illustrate the location of the perimeter in the view of FIG. 3.

In some embodiments, substrate 46 may comprise n-type silicon carbide having a polytype selected from the group consisting of the 2H, 4H, 6H, 8H, 15R, and 3C polytypes of silicon carbide. It will be appreciated by those skilled in the art, however, that substrate 46 could comprise another material such as sapphire, gallium nitride, aluminum nitride or another suitable material such as MgO, spinel, silicon or ZnO. Moreover, the substrate 46 may be conductive to permit the formation of a vertical device, or the substrate 46 could be insulating or semi-insulating.

In some embodiments of the invention, metal contact 47 may serve as the implant mask for implanting ions 40 into the device. For example, if metal contact 47 comprises a metal stack with sufficient thickness to prevent ions 40 from reaching layer 41, then it may be possible to avoid depositing a separate implant mask.

As FIG. 3 schematically illustrates, in one embodiment, the method comprises implanting ions such as nitrogen or phosphorus in the p-type layer of gallium nitride. Other ions can be used to increase the resistivity of the region via implantation, including hydrogen, helium, aluminum and $N_2$. Other aspects of the method will be illustrated with respect to FIG. 5.

The implantation can be carried out in conventional fashion and at room temperature. As presently best understood (and without being limited by a particular theory), the implanting ions create damage within the GaN to produce deep levels within the bandgap. These in turn trap free carriers in the GaN thus rendering the material highly resistive.

Light-emitting diodes in Group III nitrides such as GaN are not limited to using n-type substrates and p-type top layers. There are, however, a number of reasons, well understood in this art, as to why n-type SiC substrates are more commonly used. Thus, the invention could also include implanting an n-type layer to increase its resistivity. Because the use of n-type substrates is more common, however, most of the description herein will refer to such structures.

Although light emitting diodes that incorporate two layers (n and p-type) of gallium nitride are illustrated, those familiar with and of ordinary skill in this art will recognize that the diode 42 can include one or more quantum wells, or superlattice structures or both and that the active layer or layers can include a greater range of the Group III nitride compounds than gallium nitride standing alone. These variations, however, need not be elaborated in detail in order to clearly understand the invention, and thus, they are not discussed in detail herein. Thus, the relevant portions of more elaborate devices may also be referred to as, "active layers," "diode portions," "diode regions," or "diode structures," without departing from the scope of the present invention.

Figure 4:
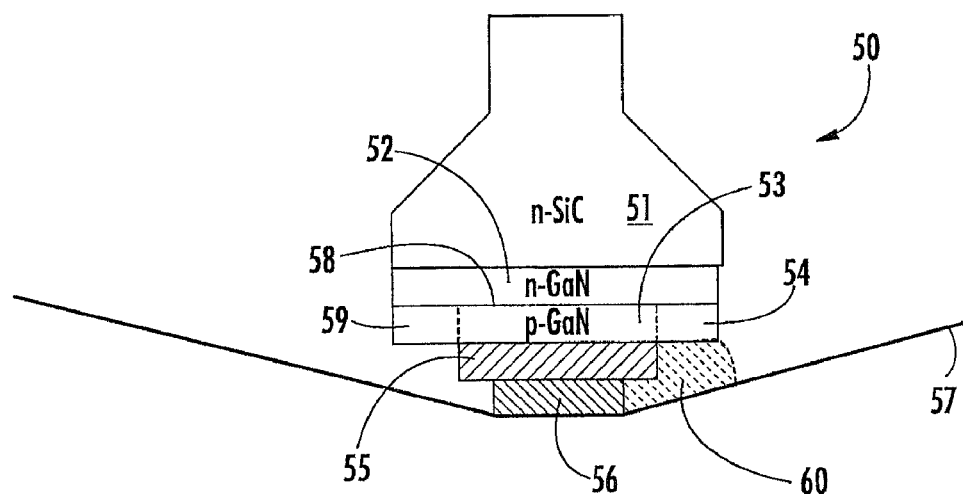
FIG. 4 is a cross-sectional diagram of an LED according to the invention mounted on a lead frame in a flip-chip orientation.

FIG. 4 is a schematic cross sectional diagram similar to FIG. 1, but illustrating a diode broadly designated at 50 that incorporates the implanted perimeter region 54 of the present invention. The diode 50 includes a substrate, 51 which in some embodiments is n-type silicon carbide.

An n-type gallium nitrite epitaxial layer is on the substrate 51, and appears underneath the substrate 51 in the "flip-chip" orientation illustrated in FIG. 4. The p-type layer 53 is adjacent the n-type layer 52 and the two layers define a p-n junction 58 between them. The diode also includes the ohmic contact 55, and the die attach metal portion 56.

Because the diode has been implanted in the manner just described with respect to FIG. 3, it includes the highly resistive perimeter portions 54 shown adjacent the dotted lines in FIG. 4. A portion 60 of less than ideally placed die attachment metal is also illustrated 54 on the lead frame 57. As thus illustrated, the invention provides several advancements. First, the geometric spatial area available for the metal portion 60 is now more limited because the implanted regions 54 of the diode 50 do not require the multiple steps necessary to form a mesa. Thus, the p-type layer and its insulated portions 54 provide an additional geometric, spatial blocking of the excess metal 60. Additionally, because the implanted portions 54 are highly resistive, there is little or no electrical interaction between the excess metal 60 and the implanted perimeter portions 54. Finally, the amount of excess undesired metal 60 that would be required to reach the n-type epitaxial layer 52 is much greater. Stated differently, the invention provides a greater margin for error when using a standard or defined amount of die attachment metal 56, 60. As noted earlier with respect to FIG. 1, in operation and practice, the diode 50 would have both anode and cathode connections to the lead frame but the details of these connections have been eliminated to clarify the illustration of the invention.

Further to some additional details of the invention, the substrate 51 is illustrated in FIG. 4 as being formed of conductive silicon carbide, but can also comprise semi-insulating silicon carbide or sapphire (which is insulating), because the advantages of the invention are based upon advantages provided in the epitaxial layers. Thus, although an insulating or semi-insulating substrate requires a slightly different geometry than a conductive SiC substrate for packaging purposes, the principles with respect to the invention and the epitaxial layers remain the same. Furthermore, for a light emitting diode, the substrate 51 is preferably substantially transparent to the light emitted by the junction 58 when a potential difference is applied to the device. Because silicon carbide emits in the higher energy portions of the visible spectrum, the substrate is preferably substantially transparent to light having wavelengths of between about 390 and 550 nanometers, and more preferably between about 485 and 550 nanometers.

U.S. Pat. No. 5,718,760 and its siblings Nos. 6,025,289 and 6,200,917, describe techniques for producing colorless SiC. These patents are commonly assigned with the present invention, and are incorporated entirely herein by reference.

As stated above, the semiinsulating border portions 54 have sufficient resistivity to preclude Schottky behavior when the border 54 is in contact with the metal 56, 60 that would otherwise produce Schottky behavior if the border 54 were n-type.

Figure 7:
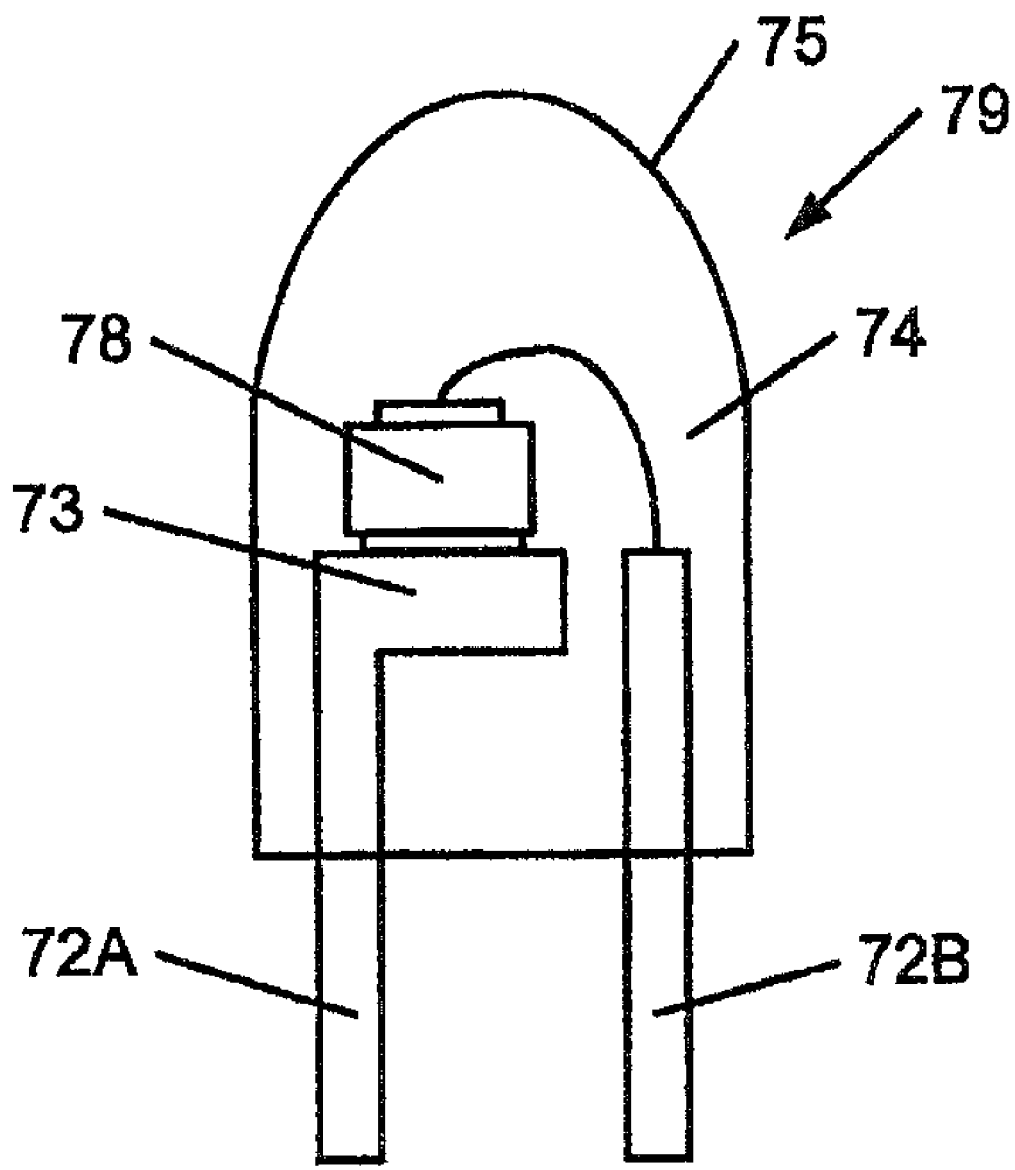
FIG. 7 is a cross-sectional illustration of embodiments of the invention packaged in lamp form.

As illustrated in FIG. 7, a light emitting diode 78 of the invention and of the type illustrated in FIG. 3 or FIG. 4 can be mounted in a package comprising a header 73, electrical leads 72, and an encapsulant 74 (such as epoxy) which may be molded in the shape of a lens 75. LED 78 may be mounted in a conventional substrate-down orientation or in a "flip-chip" orientation with the epitaxial layers adjacent the header 73. The resulting LED lamp 79 can be incorporated as part of a display or can be used as an indicator light, backlight or other application.

The ohmic contacts to the p-type layer are typically selected from the group consisting of platinum, nickel, gold, titanium, aluminum, silver, and combinations of these, and when an ohmic contact is made to the silicon carbide substrate, it is usually selected from the group consisting of nickel, platinum, palladium, aluminum, titanium, and combinations thereof. Because the ohmic contacts to the substrate (not illustrated in FIG. 4) are visibly located in the direction in which light is desirably emitted, and because larger contacts have current-spreading advantages, the ohmic contact is preferably selected and formed to be as close to transparent as possible, typically with an additional smaller bonding pad being added to enhance the flow of current to the appropriate circuit.

In a similar manner, the ohmic contacts 55 and the die attach metal 56 can be selected to act as a mirror or reflector to enhance the eventual output or the diode 50 when packaged and in use. Alternatively, and additional metal layer (or layers) can be included for this purpose. Moreover, other metal layers may be included in the metal stack for other purposes, such as barrier layers for preventing diffusion of contaminants and bonding layers for bonding external contacts to the device.

As noted above with respect to the basic illustration of the device and with respect to the method, the structure of the invention is not limited to the schematic illustration of FIG. 4. For numerous reasons, a buffer layer is often included as part of the structure between the silicon carbide substrate and the first gallium nitride (or other Group III nitride) layer. In many cases, the buffer layer can comprise aluminum nitride, or a graded layer of aluminum gallium nitride (AlGaN) that progresses from a higher aluminum concentration near the silicon carbide substrate to a higher gallium nitride concentration at its interface with the gallium nitride epitaxial layer. Other structural portions that can be incorporated into diodes of this type and with which the invention is particularly suitable include superlattice structures for enhancing the overall crystal stability of the device, quantum wells for enhancing the output of light or tuning it to a particular frequency, or multiple quantum wells for enhancing the brightness of the device by providing the additional number of active layers and the relationships between them. In addition, it may be desirable to passivate the exposed surfaces of the epitaxial layers 52, 53 of the device 50 for environmental protection. As described above, such passivation may comprise silicon dioxide or silicon nitride deposited via PECVD, sputtering, or other suitable passivation technique.

Figure 5:
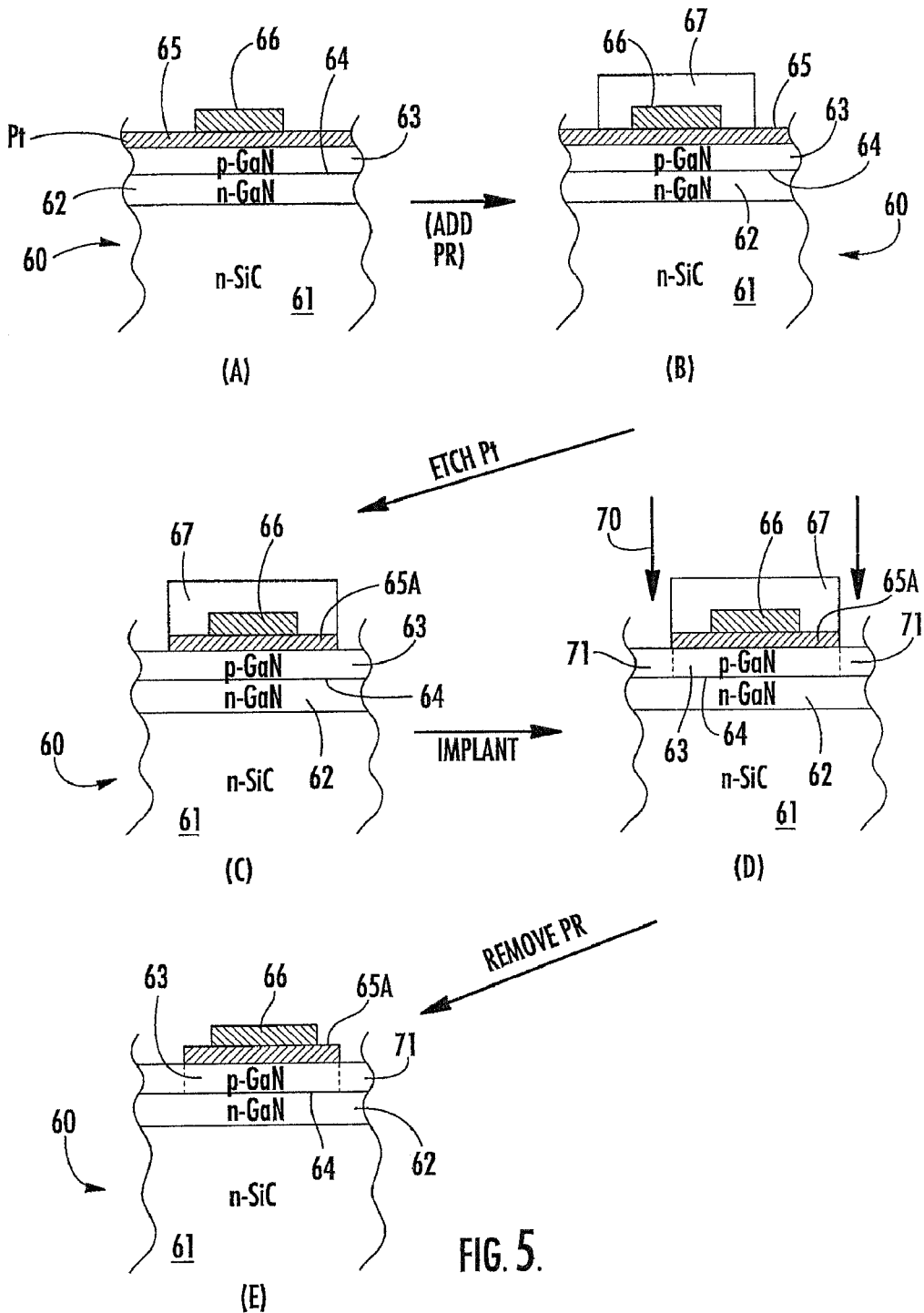
FIGS. 5(A) through 5(E) are progressive schematic cross-sectional views of the method steps of embodiments of the invention.

FIG. 5 illustrates some of the method aspects of the invention. In a broad sense, the method electrically defines or isolates a p-n junction in a diode, most preferably in a Group III nitride or gallium nitride-based diode, to minimize or avoid undesired electrical contacts and pathways when the diode is mounted for use and/or to prevent damage to the p-n junction during die separation. In this aspect, the method comprises depositing an ohmic metal contact layer on a central portion of a p-type epitaxial layer of gallium nitride that is part of a p-n junction, patterning the metal layer by applying an etch mask on the metal layer and removing a portion of the etch mask and the metal layer, and then implanting ions into the perimeter portions of the p-type epitaxial layer that are not covered by the etch mask.

In a slightly more detailed aspect, the method can comprise masking a portion of the ohmic metal layer (and potentially a bond pad on the ohmic contact), removing the remaining exposed ohmic metal contact layer from the epitaxial layer, implanting the exposed portions of epitaxial layer with atoms sufficient to increase the resistivity of the exposed portions (and potentially render the exposed portions semi-insulating), and removing the mask from the ohmic contact (and the bond pad) to thereby produce high-resistivity portions of the p-type layer. In this aspect, the method can comprise depositing the ohmic contact and the bond pad prior to the masking step, and masking the ohmic contact metal with the photoresist.

Turning to FIG. 5 in more detail, it illustrates a device precursor broadly designated at 60. The diode precursor 60 includes a substrate 61 (which in certain embodiments comprises n-type SiC), an n-type gallium nitride epitaxial layer 62 on the substrate 61, a p-type gallium nitride epitaxial layer 63 on the n-type layer 62, an ohmic contact layer 65 on the p-type layer 63, and a metal bond pad 66 on the ohmic contact layer 65. The various steps of forming the substrate and epitaxial layers and depositing the ohmic contact and bond pad are generally well understood in the art and will not be described in detail herein. Representative descriptions are included in issued patents including but not limited to commonly assigned U.S. Pat. Nos. 6,297,522; 6,217,662; 6,063,186; 5,679,153; 5,393,993; and 5,119,540.

FIG. 5(B) illustrates the diode precursor 60 after a photoresist has been deposited, masked, and patterned to form the photoresist portion 67 on all of the bond pad as illustrated in FIG. 5(B) and some, but not all, areas of the ohmic contact 65. The precursor in FIG. 5(B) is then etched to remove the portions of the ohmic contact layer 65 that are not covered by the photoresist 67. The etching can be carried out in any appropriate manner, with reactive ion etching (RIE) using a chlorine-based plasma being a possible method. The etching results in the structure shown in FIG. 5(C) in which the size of the ohmic contact has been reduced to an area represented as 65(a). FIG. 5(C) also illustrates that with a portion of the ohmic contact layer 65 removed, portions of the p-type epitaxial gallium nitride layer are uncovered.

FIG. 5(D) thus shows the implantation (schematically) of ions 70 to form the highly resistive regions 71 in the p-type gallium nitride layer 63 that define and isolate the junction 64. In some embodiments, the highly resistive implanted regions 71 are semi-insulating.

Alternatively, the implant step illustrated in FIG. 5(D) may be performed prior to the step of etching the ohmic contact layer 65 if the ohmic contact layer 65 is sufficiently thin so as not to substantially interfere with the implantation step.

When the photoresist 67 is removed, the precursor structure illustrated in FIG. 5(E) results. The precursor structures may then be separated into individual die.

Because the photoresist 67 serves as a mask for two steps (etching the ohmic contact layer 65 and implanting the ions 70), the method of the invention reduces fabrication cycle time, wafer handling and chemical consumption, and likewise reduces the yield loss otherwise associated with the masking and etching procedures.

Figure 6:
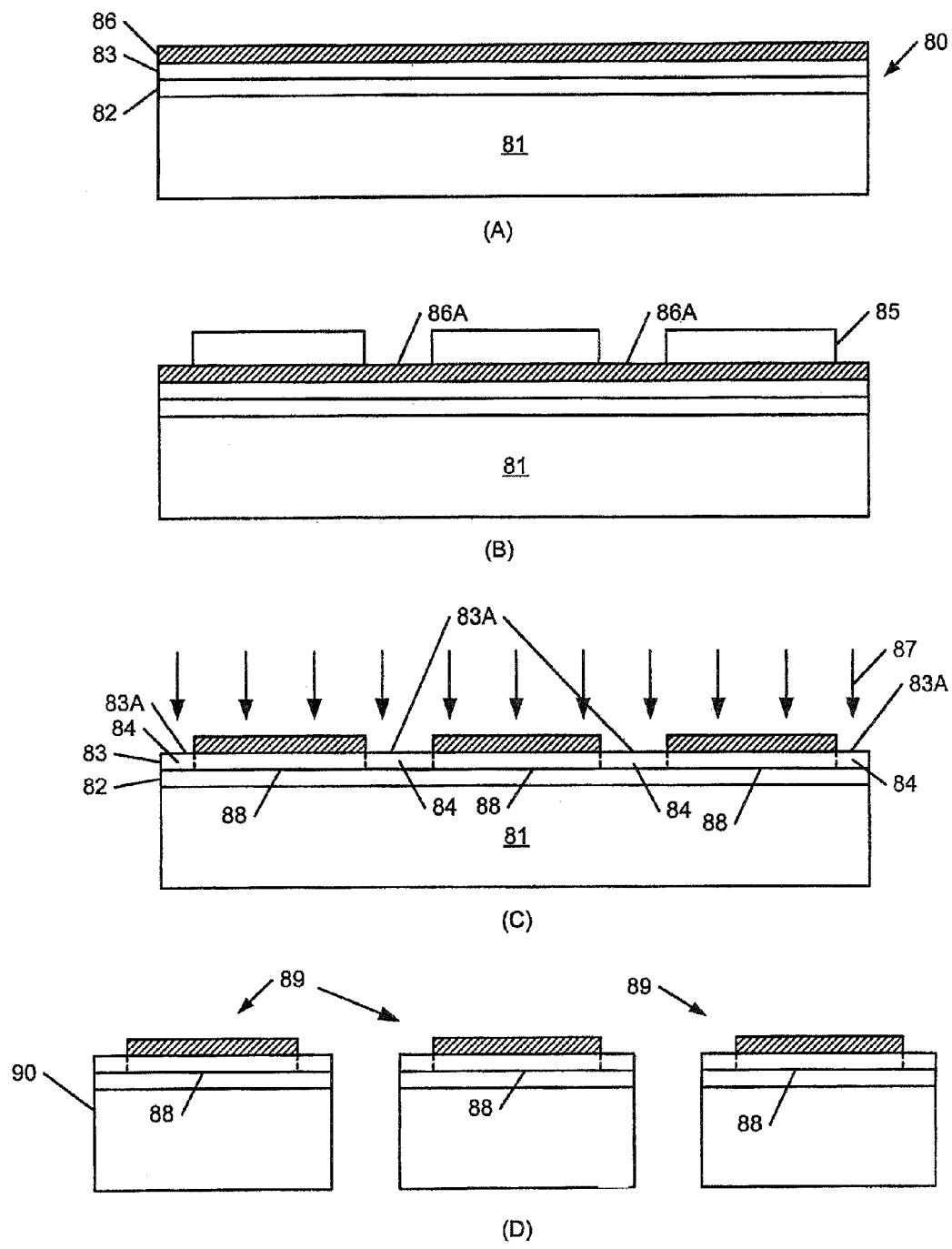
FIGS. 6(A) through 6(D) are progressive schematic cross-sectional views of the method steps of further embodiments of the invention.

Another embodiment of the invention is illustrated in FIG. 6(A)-(D). In this embodiment, a wafer 80 comprising a substrate 81 and epitaxial regions 82 and 83 is provided. As illustrated in FIG. 6(A), a metal stack 86 is formed on epitaxial region 83. As discussed above, epitaxial region 83 has a first conductivity type and epitaxial region 82 has a second conductivity type opposite the first conductivity type. Each epitaxial region 82 and 83 may comprise one or more layers having the same conductivity type. Metal stack 86 may comprise a number of metal layers, each of which has a particular function. For example, metal stack 86 may comprise a layer of metal for forming an ohmic contact with epitaxial region 83. Metal stack 86 may also comprise reflector, barrier, adhesion, bonding, and/or other layers.

As illustrated in FIG. 6(B), etch mask 85 is deposited on metal stack 86 and patterned via photolithography to form openings that selectively reveal surface portions 86A of metal stack 86. Alternately, metal stack 86 could be formed by photolithography, deposition and liftoff techniques which are well known in the art. That is, metal stack 86 could be formed by applying a blanket photoresist to the surface of the epitaxial region 83, patterning the photoresist by exposing and developing it, depositing the metal as a blanket layer and lifting off the unwanted metal.

Turning now to FIG. 6(C), metal stack 86 is selectively etched to reveal surface portions 83A of epitaxial region 83. Etch mask 85 is then removed by conventional methods. Ions 87 are then implanted into the exposed portions of epitaxial region 83 to render the implanted regions 84 highly resistive in the manner described above and to define p-n junction regions 88 within the structure. In this embodiment, the patterned metal layer 86 serves as the implant mask.

Finally, as illustrated in FIG. 6(D), the etch/implant mask 85 is removed and individual die 89 are separated using conventional techniques such that defined p-n junction regions 88 are spaced apart from the sidewalls 90 of the die, and are thereby physically and electrically isolated.

EXPERIMENTAL

The following implantation procedures were carried out in evaluating the present invention:

In each of the following evaluations, an LED precursor comprising an n-type silicon carbide substrate, an n-type epitaxial region and a p-type epitaxial region was provided. The p-type epitaxial region comprised GaN/AlGaN layers doped with Mg at a carrier concentration of about 1 to $5 \times 10^{17}$ cm-3 and had a total thickness of about 210 nm. In a first evaluation, successive doses of 20 keV of monovalent nitrogen ($N^{+1}$) at a dosage of $10^{13}$ per square centimeter (cm-2), 125 keV of $N^{+1}$ at a dosage of $1.4 \times 10^{13}$ cm-2, and 125 keV of divalent nitrogen ($N^{+2}$) at a dosage of $2 \times 10^{13}$ cm$^{-2}$ were carried out.

In a second evaluation, $N^{+1}$ nitrogen was implanted at 20 keV at a dosage of $10^{13}$ cm$^{-2}$ followed by a dosage at 125 keV of monovalent nitrogen at $1.4 \times 10^{13}$ cm$^{-2}$.

In a third evaluation, the first dosage was carried out at 20 keV using $N^{+1}$ at a dosage of $10^{13}$ cm$^{-2}$, followed by 125 keV of at a dosage of $1.4 \times 10^{13}$ cm$^{-2}$ followed by 190 keV of N+1 at $1.7 \times 10^{13}$ cm$^{-2}$.

Of the three conditions, all produced junction isolation and definition. Junction isolation was verified by probing adjacent metal stacks and performing a continuity measurement. No measurable current was observed prior to breakdown of the p-n junction. Implanted helium and hydrogen have also created resistivity conditions leading to the potential conclusion that implanting almost any ion into p-type gallium nitride at room temperature will cause the material to become dramatically more resistant.

The inventors, however, do not wish to be bound by any particular theory. Accordingly, the potential conclusions discussed herein are offered for the sake of illustration rather than limitation.

These implantation steps rendered the edges of the junction insulating and inert (as desired). The implantation step is also favorable for p-type gallium nitride because of the low hole concentrations (about $1\times10^{17}$ cm$^{-3}$) that p-type gallium nitride demonstrates. The inert characteristic produced by the implant of the invention appears to be stable to temperatures approaching 900° C. Thus, junction isolation by this technique appears to lend itself to any nitride device that incorporates a p-type layer. For this reason, nitride based light emitting diodes on sapphire as well as on silicon carbide and other substrates appear to benefit equally from the use of implantation for junction isolation.

The following evaluations were carried out on commercial dies from Cree, Inc.

The standard implant condition was (1) below. Other conditions (2)-(5). were also examined. The (2) condition was intended to evaluate the number of carriers that are eliminated per implanted ion. Conditions (3) and (5) were intended to evaluate the effect of implanting on the p-side of the device only. Condition (4) evaluated the efficiency of trapping carriers similar to the (1) and (2) comparison. In carrying out the implantations, it was determined that higher energy implants were needed for Cree's green LEDs as compared to Cree's blue LEDs.

Implant Conditions Explored on Blue (Indicating Successive Doses):

1e13 @ 20 keV, 1.4e13 @ 125 keV, 1.7e13 @ 190 keV (standard triple dose condition)

1e12 @ 20 keV, 1.4e12 @ 125 keV, 1.7e12 @ 190 keV (standard condition @ $\frac{1}{10}$ dose)

1.4 e13 @ 125 keV (single dose from standard condition of #1)

1.4 e12 @ 125 keV ($\frac{1}{10}$ dose of #4)

1e13 @ 30 keV, 1.4e13 @ 100 keV

For Cree's blue light emitting diodes and based on TRIM simulations the 190 keV implant of (1) and (2) goes far deeper than the p-n junction placing most of the 190 keV implanted nitrogen on the n-side. The single dose at 125 keV of (3) and (4) and the double dose of (5) were considered. The 100 and 125 keV energies place the peak of the nitrogen concentration at or about the p-n junction which is 1500-1800 A below the surface. The simulated peak for the 100 and 125 keV implants is about 1600 and 2000 A, respectively. The GaN material is converted from low resistivity to high resistivity.

P-type GaN is about 1200-1500 A thick with a free hole concentration of about 2-5 E17/cm$^3$ P-type AlGaN is about 300 A thick with a hole concentration of about 5-20 E16/cm$^3$ Condition (1) always worked for the blue LEDs (i.e., desired isolation and electrostatic discharge (ESD) yield).

Condition (2) successfully isolates devices, but the ESD yield is poor.

Condition (3) isolates the devices with good ESD yield.

Condition (4) does not quite isolate the devices and does not offer good ESD yield.

Condition (5) isolates the devices with good ESD yield.

For Cree's Green light emitting diodes, each of conditions (1)-(5) created high resistivity p-type material and isolated adjacent devices, but none produced good ESD yield. The addition of a further 230 keV nitrogen implant with a dose of 2 E 13/cm$^2$, however, worked well for isolation and ESD yield.

Production Recovery Process: Other devices were passivated post fabrication in which cases the device had a silicon nitride covering about 1600 A thick. The best conditions for blue remained condition (1) above, but with an extra 30 keV of energy to penetrate the passivation layer. Similar results were obtained for the green LEDs by adding the extra 30 keV to the added 230 keV implant at 2 E13/cm$^2$. The doses were unchanged.

Estimation of resistivity: The resistivity was estimated to be greater than $2\times10^3$ ohm-cm. This was done by evaluating the current flowing between two adjacent pads with an applied voltage of 2 Volts. The resulting current was unmeasurable (<50 nA). This corresponds to a resistance greater than $40\times10^6$ ohms. The distance between the pads is 70 microns and the width is 230 microns. The number of squares is then about 0.3 between them. The effects of fringing were ignored to give the estimate a worst case lower limit on resistivity. This gives a lower limit on the sheet resistance of $133\times10^6$ ohms per square. Taking the thickness to be $0.15\times10^{-4}$ cm thick yields a resistivity of greater than 2000 ohm-cm.

Embodiments of the invention have been set forth in the drawings and specification, and although specific terms have been employed, they are used in a generic and descriptive sense only and not for purposes of limitation, the scope of the invention being defined in the claims.

The invention claimed is:

1. A semiconductor light emitting diode comprising:
a semiconductor active structure for providing an optical emission when current is injected therethrough;
an epitaxial layer of a Group III nitride that includes a top surface, a bottom surface and a side edge on a top surface of said active structure, wherein said epitaxial layer includes a p-type central region and a highly resistive Group III nitride border region that surrounds said p-type central region of the epitaxial layer for electrically isolating said p-type central region of the epitaxial layer; and
a contact layer on the top surface of the epitaxial layer that defines the p-type central region of the epitaxial layer while exposing the highly resistive Group III nitride border region of the epitaxial layer,
wherein the highly resistive Group III nitride border region extends to the side edge of the epitaxial layer.

2. A light emitting diode according to claim 1 wherein said active structure comprises one or more Group III nitride compositions.

3. A light emitting diode according to claim 1 wherein said highly resistive Group III border region has sufficient resistivity to preclude Schottky behavior when said border is in contact with a metal.

4. A light emitting diode according to claim 1 wherein said highly resistive Group III border region has sufficient resistivity to preclude Schottky behavior when said border is in electrical contact with said contact layer.

5. A light emitting diode according to claim 1 mounted on a lead frame with said contact layer in electrical contact with said lead frame.

6. A light emitting diode according to claim 1 wherein said contact layer is selected from the group consisting of platinum, nickel, gold, titanium, aluminum, silver, and combinations thereof.

7. A light emitting diode according to claim 1 further comprising:
a semiconductor substrate; and
a buffer layer on said semiconductor substrate;
and with said semiconductor active structure on said buffer layer.

8. A light emitting diode according to claim 1 wherein the contact layer has sufficient thickness to serve as an ion implantation mask.

9. A light emitting diode according to claim 1 wherein the highly resistive Group III nitride border region comprises a region of the epitaxial layer that includes implanted nitrogen, phosphorus, hydrogen, helium, aluminum and/or $N_2$ ions.

10. A light emitting diode according to claim 1 wherein the active structure includes at least one quantum well.

11. A light emitting diode according to claim 10 wherein the light emitting diode further includes at least one superlattice structure.

12. A light emitting diode according to claim 5 wherein said light emitting diode is mounted in a flip-chip orientation so that the epitaxial layer is between the active structure and the lead frame.

13. A light emitting diode according to claim 1 further comprising:
a conductive semiconductor substrate on the active structure opposite the epitaxial layer;
an ohmic contact on the semiconductor substrate; and
a bonding pad that is smaller than the ohmic contact on the ohmic contact.

14. A light emitting diode according to claim 1 further comprising a passivation layer on exposed surfaces of the epitaxial layer.

15. A semiconductor light emitting diode comprising:
a lead frame;
a light emitting diode chip that comprises:
an n-type Group III nitride epitaxial layer;
a Group III nitride epitaxial layer that includes a top surface, a bottom surface and side edges on a top surface of the n-type Group III epitaxial layer, the Group III nitride epitaxial layer including a p-type central region and a highly resistive Group III nitride border region that surrounds said p-type central region and extends to a side edge of the Group III nitride epitaxial layer; and
a contact layer on the top surface of the Group III nitride epitaxial layer that exposes the highly resistive Group III nitride border region,
a bonding pad on the contact layer; and
a die attach metal that attaches the bonding pad to the lead frame.

16. A light emitting diode according to claim 15 further comprising:
a semiconductor substrate on the n-type Group III nitride epitaxial layer opposite the Group III nitride epitaxial layer;
an ohmic contact on the semiconductor substrate; and
a bonding pad that is smaller than the ohmic contact on the ohmic contact.

17. A light emitting diode according to claim 16 further comprising a passivation layer on exposed surfaces of the Group III nitride epitaxial layer.

18. A light emitting diode according to claim 17 wherein the contact layer covers the entire p-type central region of the Group III nitride epitaxial layer.

19. A semiconductor light emitting diode comprising:
an n-type Group III nitride epitaxial layer;
a Group III nitride epitaxial layer nitride that includes a top surface, a bottom surface and a side edge on a top surface of the n-type Group III epitaxial layer, the Group III nitride epitaxial layer including a p-type central region and a highly resistive Group III nitride border region that surrounds said p-type central region and extends to the side edges of the Group III nitride epitaxial layer; and
a contact layer on the top surface of the Group III nitride epitaxial layer that exposes the highly resistive Group III nitride border region,
wherein the highly resistive Group III nitride border region does not extend into the n-type Group III nitride epitaxial layer.

* * * * *